United States Patent
Rieger

(10) Patent No.: US 11,088,705 B2
(45) Date of Patent: Aug. 10, 2021

(54) PHASE-SHIFTING ENCODING FOR SIGNAL TRANSITION MINIMIZATION

(71) Applicant: Synopsys, Inc., Mountain View, CA (US)

(72) Inventor: Michael Lawrence Rieger, Skamania, WA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 16/347,539

(22) PCT Filed: Nov. 6, 2017

(86) PCT No.: PCT/US2017/060214
§ 371 (c)(1),
(2) Date: May 3, 2019

(87) PCT Pub. No.: WO2018/093600
PCT Pub. Date: May 24, 2018

(65) Prior Publication Data
US 2019/0363732 A1 Nov. 28, 2019

Related U.S. Application Data
(60) Provisional application No. 62/418,036, filed on Nov. 4, 2016.

(51) Int. Cl.
*H03M 7/00* (2006.01)
*H03M 7/30* (2006.01)
(52) U.S. Cl.
CPC ..................... *H03M 7/30* (2013.01)
(58) Field of Classification Search
CPC ....................................................... H03M 7/30
USPC .............................................. 341/50, 51, 52
See application file for complete search history.

(56) References Cited

U.S. PATENT DOCUMENTS

| | | | | |
|---|---|---|---|---|
| 5,805,632 A * | 9/1998 | Leger | .................. | H04L 25/4904 341/55 |
| 8,605,912 B2 * | 12/2013 | Elkhatib | ................. | H04L 7/033 381/22 |
| 2005/0094756 A1 * | 5/2005 | Bertram | ............. | H04L 25/4904 375/360 |
| 2008/0037693 A1 | 2/2008 | Andrus et al. | | |
| 2008/0291063 A1 * | 11/2008 | Hollis | ..................... | H03M 5/16 341/55 |

(Continued)

FOREIGN PATENT DOCUMENTS

WO    WO 2018/093600 A2    5/2018

OTHER PUBLICATIONS

EP 1772412 Extended European Search Report dated Apr. 22, 2020.
(Continued)

*Primary Examiner* — Peguy Jean Pierre
(74) *Attorney, Agent, or Firm* — Alston & Bird LLP

(57) ABSTRACT

A method of encoding a stream of data bits includes encoding a bit 1 of the data stream as a first symbol if a bit immediately preceding the bit 1 is encoded as 0 and a bit of the data stream immediately succeeding the bit 1 is 0, encoding the bit immediately succeeding the bit 1 as 1, encoding a bit 0 of the data stream as a second symbol if a bit immediately preceding the bit 0 is encoded as 1 and a bit of the data stream immediately succeeding the bit 0 is 1, and encoding the bit immediately succeeding the bit 0 as 0.

30 Claims, 12 Drawing Sheets

(56) References Cited

U.S. PATENT DOCUMENTS

2016/0286215 A1    9/2016  Gamei et al.

OTHER PUBLICATIONS

Preethi, et al., "An Efficient Coding Technique to Reduce Dynamic Poower Consumption for Serial Links," International Journal of Advanced Research in Electrial, vol. 5, Special Issue 5, (Mar. 2016).
WIPO Application No. PCT/US2017/060214, PCT International Search Report and Written Opinion of the International Searching Authority dated Aug. 7, 2018.
WIPO Application No. PCT/US2017/060214, PCT International Report on Patentability dated Nov. 4, 2016.

\* cited by examiner

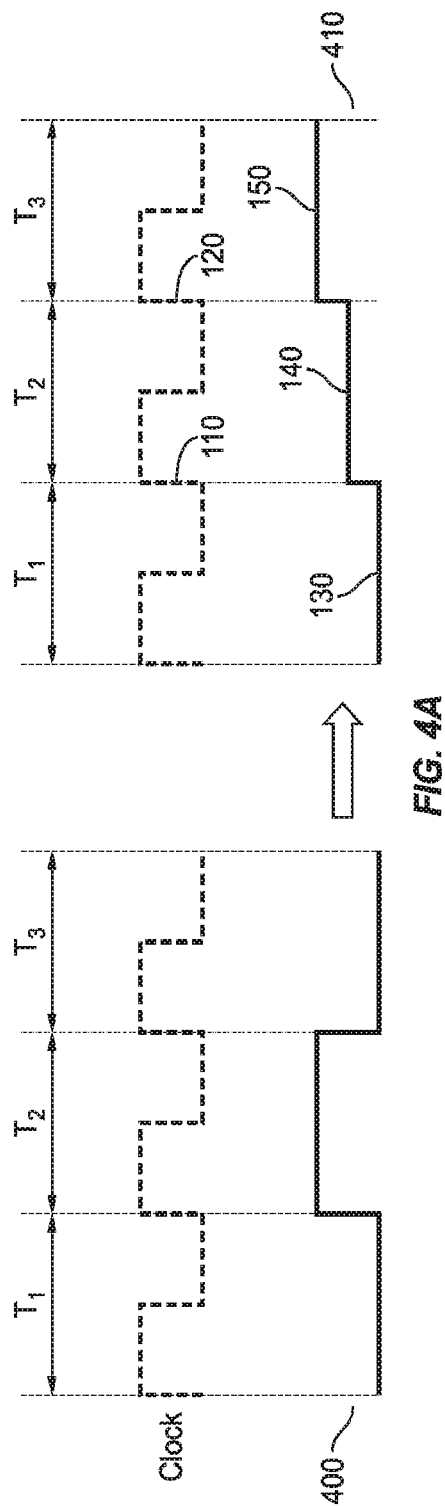

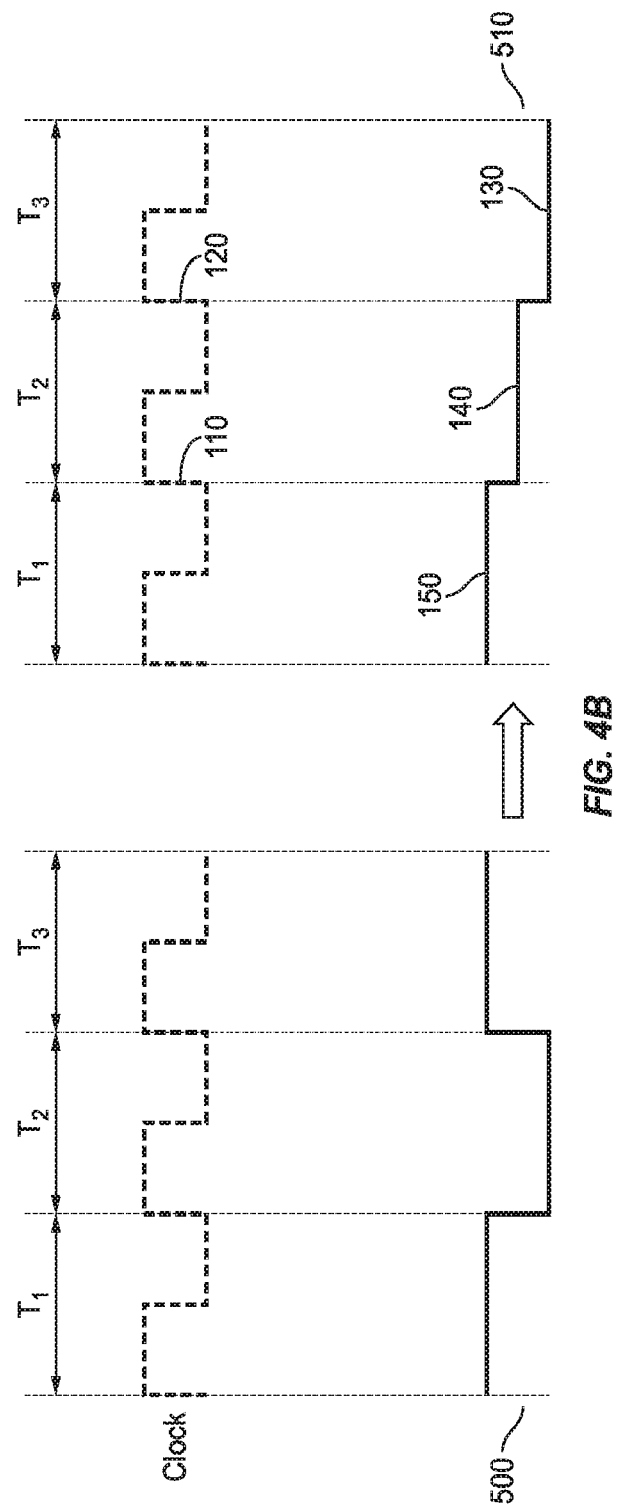

PHASE-SHIFTING ENCODING FOR SIGNAL TRANSITION MINIMIZATION

CROSS REFERENCE TO RELATED APPLICATIONS

This application is a 371 National Stage Application of PCT/US2017/060214, filed Nov. 6, 2017, which claims the benefit under 35 § U.S.C 119(e) of U.S. Provisional Patent Application No. 62/418,036, filed Nov. 4, 2016, the contents of all of which are incorporated herein by reference in their entirety.

FIELD OF THE INVENTION

The present invention relates to communication systems and methods, and more particularly to encoding and decoding of data in such communication systems.

BACKGROUND OF THE INVENTION

The power consumption of advanced integrated circuits is becoming a major limiting factor as semiconductor technology scales to more circuits and higher density. Power density increases with shrinking circuit sizes because the energy consumed by each transistor decreases at a slower rate than the packing density increases. Thus watts-per-area of power consumption climbs, even when performance is held constant. Lowering power consumption is highly valued in IC applications—from servers where utility and cooling costs are substantial, to mobile, where battery life is precious.

In CMOS logic technology, dynamic power is proportional to $fCV^2$ where f is the switching frequency, C is the capacitive load, and V is the switching voltage. In recent IC generations several logic design and architectural techniques have emerged to help manage power consumption. As the capacitive load (interconnection wires and device parasitic capacitance) is determined by the IC processes, the design methods typically involve dynamically lowering voltages and slowing switching activity within specific regions, using strategies aimed at achieving required performance as power-efficiently as possible.

In electronic communication, amplitude modulation and phase modulation are commonly leveraged for increasing the information rate within a band-limited channel. For example, two bits of information can be encoded into four amplitude levels and similarly, two bits can be encoded into four phase states. Phase modulation and amplitude modulation may be combined. For example, with four amplitude and four phase states together, four bits may be encoded into a single time sample. Typically, no consideration is given to the energy consumed by the modulated waveforms and, in most actual applications, these methods are applied to signals modulating a continuous carrier frequency and they have no direct effect on energy consumption.

The following reference describes a method for using phase information for the purpose of lowering power: "An Efficient Coding Technique to Reduce dynamic power consumption for Serial Links", T. Preethi, P. Meenakshi Vidya, S. Sudha, International Journal of Advanced Research in Electrical, Electronics and Instrumentation Engineering, Vol. 5, Special Issue 5, March 2016, henceforth "Preethi"

The method described in Preethi uses a 180-degree phase shift to signal an action. Preethi's method is a modification of a conventional transition minimization scheme where normally an extra bit is needed to signal the minimizing transformation. In Preethi the extra bit is replaced by a phase-shift. Preethi acknowledges a negative consequence of his method, by which the minimum waveform pulse width is shortened by half, resulting in a doubling of the required transmission line bandwidth.

BRIEF DESCRIPTION OF THE DRAWINGS

FIG. 4A illustrates an encoding scheme, in accordance with one embodiment of the present invention.

FIG. 4B illustrates a decoding scheme, in accordance with one embodiment of the present invention.

SUMMARY OF THE INVENTION

A signaling method is disclosed that reduces the power consumption of a data transmission while preserving the information rate. The disclosed method may also be used to increase the information rate in a band-limited channel.

Unlike conventional amplitude modulation and phase modulation techniques, the unique signaling occurs only within the voltage transition between a high voltage state and a low voltage state. The method utilizes only one special signal: a phase shift or not (or an intermediate amplitude, or not). This feature may be extended by resolving more than one non-zero phase at the voltage transition. For example, by discriminating among two non-zero phases, it is possible to extend the two special cases referenced in this description (A and B) to four special cases. Special cases A and B determine (replace in the encoded waveform) specific two bit sequences of encoded data. With four special cases, with two unique non-zero phases, a single voltage transition determines four unique bit sequences, spanning three or more bits of encoded data. Additional unique phases may extend the encoding further.

DETAILED DESCRIPTION OF THE INVENTION

Figure 1:
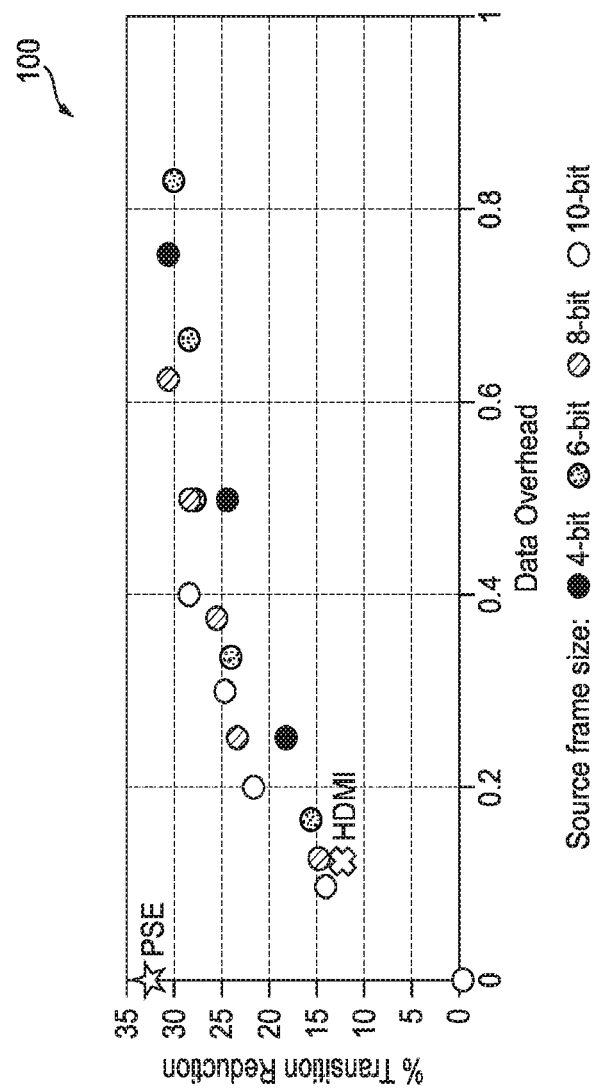
FIG. 1 illustrates an achievable transition reduction rates for conventional encoding schemes in which percent average transition minimization is plotted against the increase in encoded frame sizes.

In typical binary communication, the voltage state of the transmission terminal is periodically sampled at the leading (or trailing) edge of a synchronizing clock signal. If the voltage is high, a 'one' (1) is received, if the voltage is low, a 'zero' (0) is received. The rate of transmission is one bit per clock cycle and, for random sequences of 1s and 0s, the probability of a transition between samples is 0.5. One approach for reducing the number of high-low (1–>0), and low-high (0–>1) voltage transitions in a sequence of binary data bits is to encode an original frame of data (byte, word, . . . ) into an output frame containing a sequence of 1s and 0s with fewer transitions than in the original data frame. These encoding schemes produce a slightly larger output frame to incorporate information needed to decode at the receiver. Most schemes use the additional bits to specify a specific treatment to recover the original bits. Other possible schemes might use look-up tables to encode and decode sequences. FIG. 1 illustrates estimates of the theoretically best transition reduction rates for different input frame sizes, plotted by fractional allowances for additional bits in the encoded frame.

The well-known Transition Minimized Differential Signaling (TMDS) scheme, described in detail in the HDMI video communication standard (EIA/CEA-861), uses one additional bit for each eight-bit input frame and achieves a 12% reduction in transitions with an overhead of 0.125 (for the extra bit per byte), shown as 'X' in FIG. 1. The performance of the technique disclosed herein (referred to subsequently as 'PSE') is also plotted in FIG. 1. In generating the plot shown in FIG. 1, a computer program is used to enumerate all bit patterns within the encoded frame size which is then sorted by the number of transitions. Thereafter the average transitions of the first $2^n$ patterns, where n is the input frame size, was determined. The probability of a transition between encoded frames is assumed to be 0.5.

In addition to using one (1) and zero (0), some embodiments of the present invention use an additional symbol into the transition between high and low states to indicate whether or not a phase shift has occurred. Such a symbol is used to define two specific cases where binary sub-sequences are encoded into two unique electrical waveforms, referred to herein alternatively as A and B, from which the original binary information is decoded.

In accordance with one embodiment of the present invention, about 33% average reduction of transitions is achieved. Furthermore, with zero overhead, embodiments of the present invention maintain a 1-bit per clock cycle transmission rate. The probability of a transition between clock cycles is ⅓, compared to ½ for conventional transmission. This correspondingly reduces dynamic power associated with the capacitive load of the transmission circuit by 33%. Furthermore, the minimum pulse width, i.e., the time spent at either high or low voltage states, is 50% longer than conventional techniques, and the maximum core frequency components of the transmitted voltage waveform is approximately ⅓ less than that of conventional binary transmission techniques. These properties may relax the electrical requirements of the transmission line and may produce a lower level of electromagnetic interference compared to conventional binary transmission schemes.

Compared to alternative transition-minimizing schemes, the additional logic for coding is relatively simple, especially at the encoding end. Conventional methods analyze the inputs one frame at a time, thus adding latency at least as long as the selected frame size, whereas the latency associated with embodiments of the present invention is no more than, for example, four bits (depending on implementation) and does not require a fixed frame size.

Figure 2A:
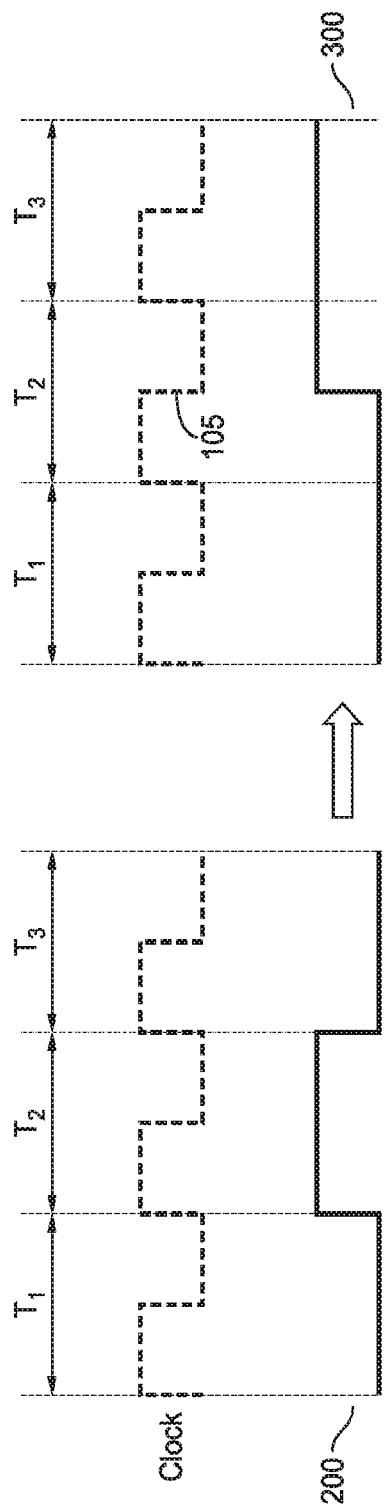
FIG. 2A illustrates an encoding scheme, in accordance with one embodiment of the present invention.
Figure 2B:
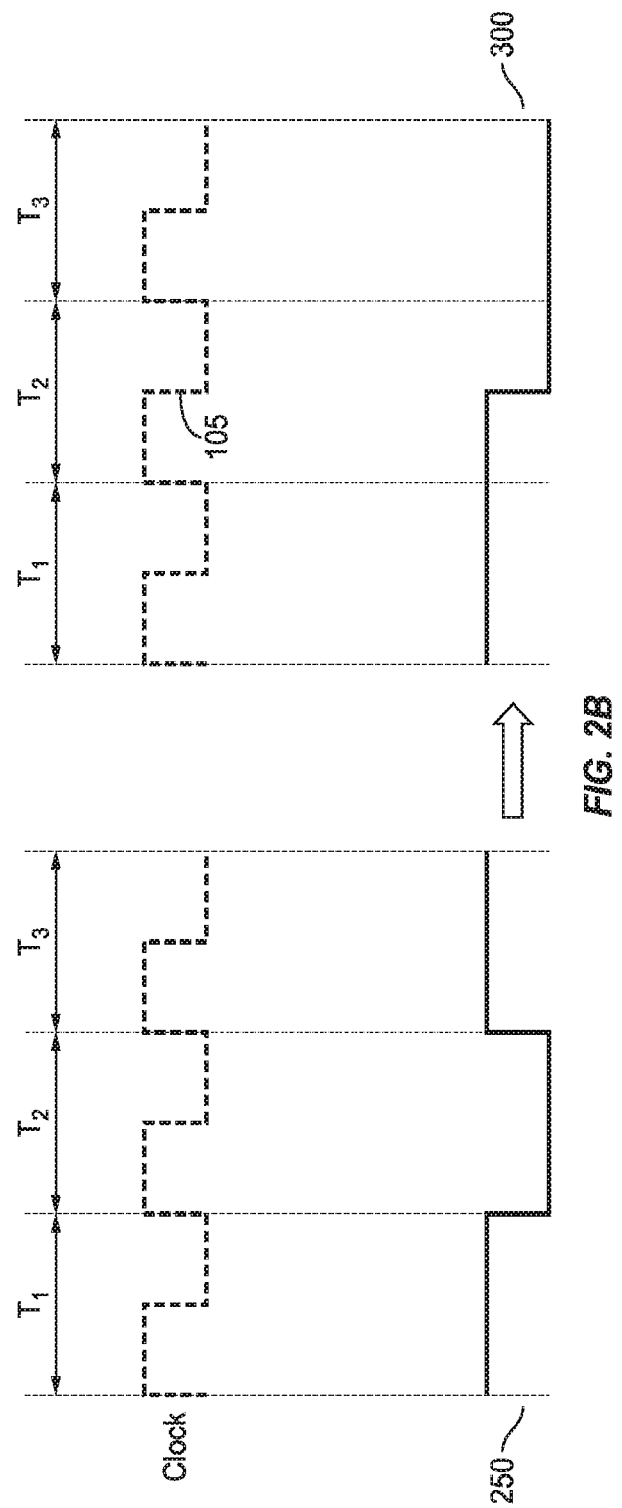
FIG. 2B illustrates a decoding scheme, in accordance with one embodiment of the present invention.

In one embodiment, the input serial sequence of 1s and 0s is analyzed and the output waveform is encoded by replacing "singleton" two-transition occurrences, (0→1→0, 1→0→1), with single transition waveforms where the transition edge is 180° phase-shifted as illustrated in FIGS. 2A and 2B.

In FIG. 2A, the input bit stream 200 is shown as including bits 0, 1 and 0 received respectively during clock periods $T_1$, $T_2$ and $T_3$ (alternatively referred to herein as the (n−1)-th clock cycle, n-th clock cycle, and (n+1)-th clock cycle, respectively). In accordance with one aspect of the present invention, the input bit stream 200 is encoded as output bit stream 300, as described further below.

Because the input bit received during clock cycle $T_1$ (immediately prior to receiving bit 1) is encoded as 0, and the input bit received during the clock cycle $T_3$ is 0, the input bit 1 received during clock cycle $T_2$ is encoded as a low-to-high transition in the encoded bit stream 200 during the second half of clock cycle $T_2$. In other words, there is a half of a clock cycle (period) delay (180 degrees phase difference) between the receipt of an input bit and the encoding of that input bit. The low-to high transition of the output bit stream 300, shown as occurring in response to the falling edge 105 of the clock during period $T_2$, represents a first encoded symbol. Furthermore, because bit 1 of the input stream 200 is encoded as a 1, bit 0 of the input data stream 200 immediately succeeding bit 1 and received during cycle $T_3$ is also encoded as a 1, as shown in encoded output stream 300.

In FIG. 2B, the input bit stream 250 is shown as including bits 1, 0 and 1 received respectively during clock periods $T_1$, $T_2$ and $T_3$ (alternatively referred to herein as the (m−1)-th clock cycle, m-th clock cycle, and (m+1)-th clock cycle, respectively). In accordance with one aspect of the present invention, the input bit stream 250 is encoded as output bit stream is 350, as described further below. Because the input bit received during clock cycle $T_1$ (immediately prior to receiving bit 0) is encoded as 1, and the input bit received during the clock cycle $T_3$ is 1, the input bit 1 received during clock cycle $T_2$ is encoded as a high-to-low transition in the encoded bit stream 350 during the second half of clock cycle $T_2$. In other words, there is a half of a clock cycle (period) delay (180 degrees phase difference) between the receipt of an input bit and the encoding of that input bit. The high-to-low transition of the output bit stream 350, shown as occurring in response to the falling edge 105 of the clock during period $T_2$, represents a second encoded symbol. Furthermore, because bit 0 of the input stream 250 is encoded as a 0, bit 1 of the input data stream 250 immediately succeeding bit 0 and received during cycle $T_3$ is also encoded as a 0, as shown in encoded output stream 350.

Data encoded in conformity with the encoding scheme described above with reference to FIGS. 2A and 2B is decoded as described in the following. An encoded symbol received during period $T_1$ is decoded as a 1 if the encoded symbol receive during immediately preceding cycle $T_0$ is 0 and, the encoded symbol received during immediately succeeding cycle $T_2$ is 1; in such conditions the encoded symbol received during cycle $T_2$ is also decoded as 0. An encoded symbol received during period $T_1$ is decoded as a 0 if the encoded symbol receive during immediately preceding cycle $T_0$ is 1 and, the encoded symbol received during immediately succeeding cycle $T_2$ is 0; in such conditions the encoded symbol received during cycle $T_2$ is decoded as 1. Therefore, the high and low states of the waveform are mapped to one or zero respectively, unless a phase-shifted transition is detected. If a low-to-high phased transition is detected (waveform 300), the current bit is assigned to 1 and the next bit is pre-assigned to 0. Conversely, if a high-to-low phased transition is detected, the current bit is assigned to 0, and the next bit is pre-assigned to 1.

Figure 3:
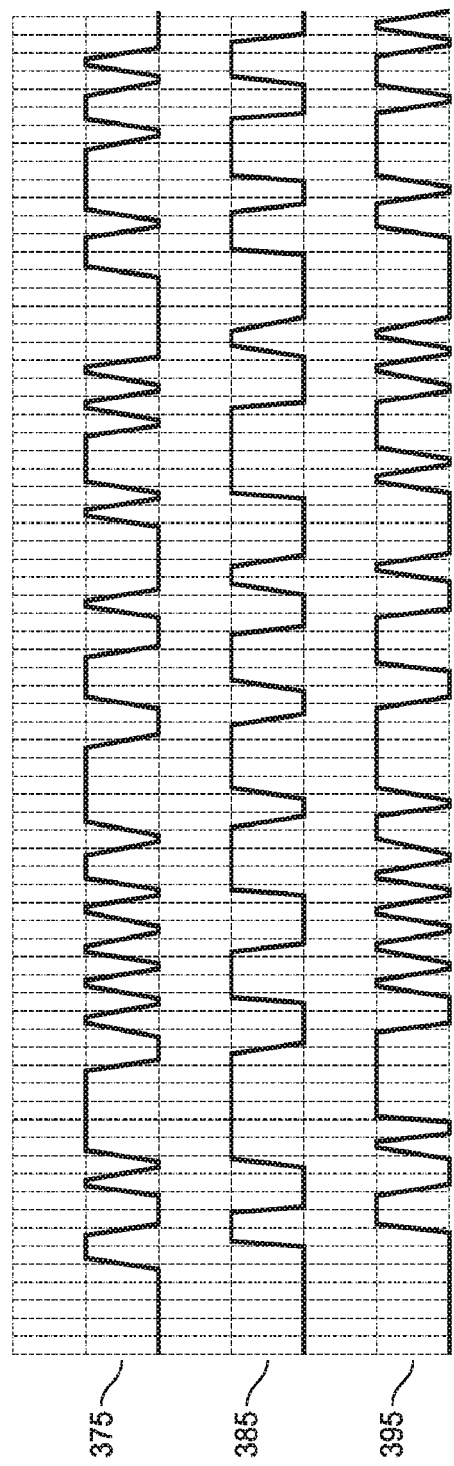
FIG. 3 illustrates an example data stream encoded and decoded, in accordance with one embodiment.

FIG. 3 shows an input bit stream 375, an encoded bit stream 385 encoded in conformity with the encoding scheme described above with reference to FIGS. 2A, 2B, as well as decoded bit stream 395 that is decoded, as described above, to recover the input bit stream 375. In other words the decoded bit stream 395 is a delayed replica of the input bit stream 375.

In FIG. 3 the encoded waveform illustrates some of the advantages of the present invention. While the overall average transition rate reduction (for random sequences) is ⅓, the rate reduction for densely alternating bit sequences is reduced by up to ⅔ as illustrated in the sub-sequence of alternating 1s and 0s within the input stream 375. One advantage is that the maximum switching activity—the number of transitions per unit time—is capped at ½ the maximum switching activity of the un-encoded bit stream. This maximum rate is reached with sequences of doublets, such as . . . 00110011 . . . ; the encoded transition rate of more rapidly switching sequences becomes lower. Although the maximum transition activity rate is halved, the transmission-line bandwidth requirement is reduced only by ⅓ as it is determined by the minimum pulse width. The minimum encoded pulse width is 50% wider than the un-encoded minimum pulse width.

FIG. 4A is an exemplary encoding scheme that uses three voltage levels and three symbols, in accordance with another embodiment of the present invention. In FIG. 4A, the input bit stream 400 is shown as including bits 0, 1 and 0 received respectively during clock periods $T_1$, $T_2$ and $T_3$. In accordance with one aspect of the present invention, the input bit stream 400 is encoded as output bit stream is 410, as described further below. In the following, the current cycle is assumed to be cycle $T_2$.

Because the input bit received during clock cycle $T_1$ (immediately prior to receiving bit 1) is encoded as the low level 130, and the input bit received during the clock cycle $T_3$ is 0, the input bit 1 received during clock cycle $T_2$ is encoded as a low-to-intermediate level transition (from a first low voltage level 130 to a second intermediate voltage level 140) in the encoded bit stream 200 in response to rising edge 110 of the clock. The intermediate level 140 represents a first symbol. Furthermore, because bit 1 of the input stream 200 is encoded as a first symbol represented by an intermediate level 140, bit 0 of the input data stream 400 immediately succeeding bit 1 and received during cycle $T_3$ is encoded as a second symbol caused by intermediate level 140 to high 150 transition, as shown in encoded output stream 300. Therefore, the high level 150 represents a second symbol.

In FIG. 4B, the input bit stream 500 is shown as including bits 1, 0 and 1 received respectively during clock periods $T_1$, $T_2$ and $T_3$. Input bit stream 500 is shown as encoded as output bit stream is 510, as described further below. In the following, the current cycle is assumed to be cycle $T_2$.

Because the input bit received during clock cycle $T_1$ (immediately prior to receiving bit 1) is encoded as the high level 150, and the input bit received during the clock cycle $T_3$ is 1, the input bit 1 received during clock cycle $T_2$ is encoded as a high-to-intermediate level transition (from a first high voltage level 150 to a second intermediate voltage level 140) in the encoded bit stream 200 in response to rising edge 110 of the clock. The intermediate level 140 represents a first symbol. Furthermore, because bit 0 of the input stream 400 is encoded as a first symbol represented by an intermediate level 140, bit 1 of the input data stream 400 immediately succeeding bit 0 and received during cycle $T_3$ is encoded as a second symbol caused by intermediate level 140 to low level 130 transition, as shown in encoded output stream 510.

Figure 5:
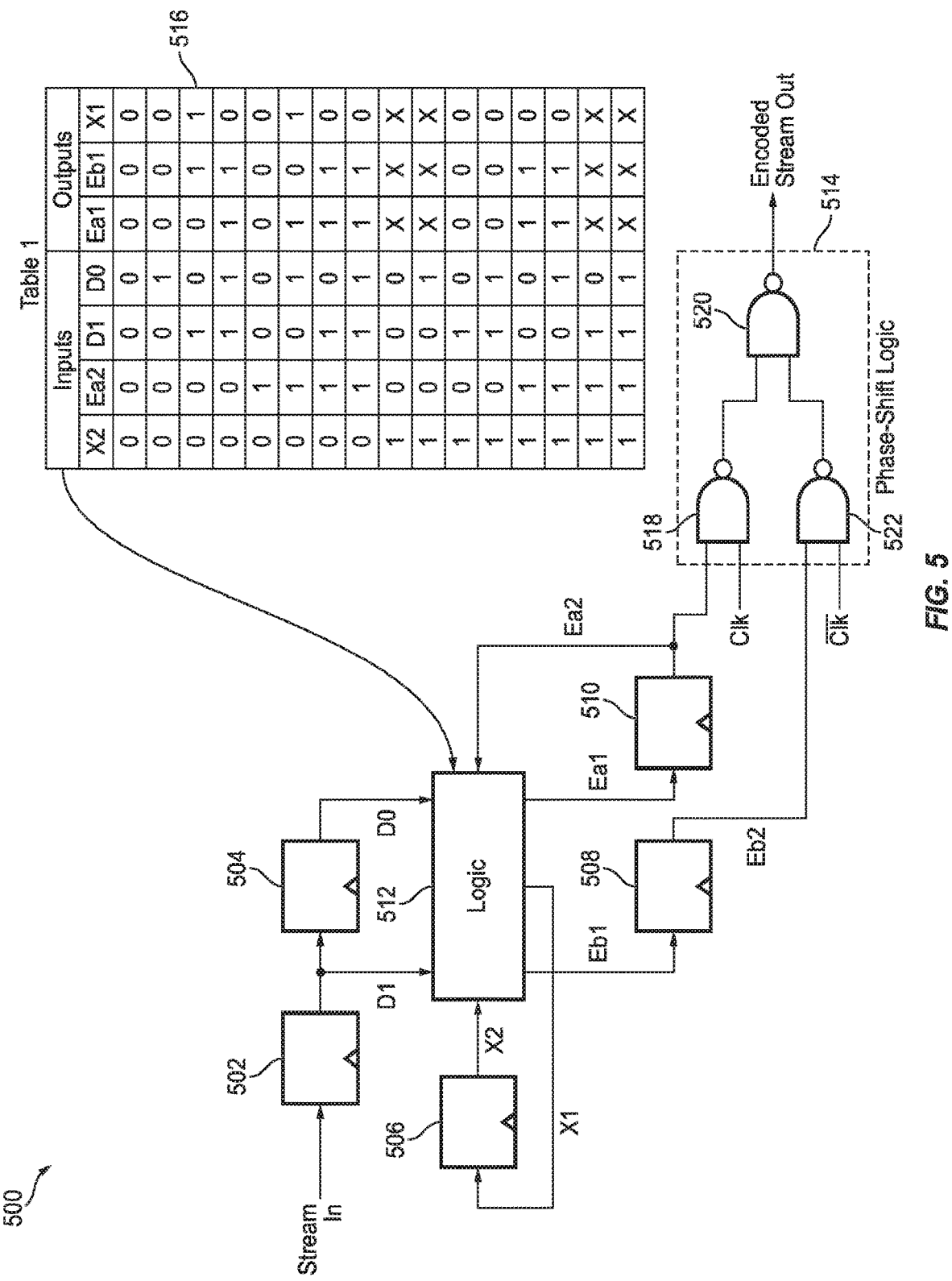
FIG. 5 is a simplified high-level block diagram of an encoder, in accordance with one embodiment of the present invention.

FIG. 5 is a simplified logic block diagram of an encoder 500 configured to encode data, as shown, for example, in FIGS. 2A and 2B, in accordance with one embodiment of the present invention. Although not shown, it is understood that an encoder configured to encode data as described above and shown with reference to FIGS. 4A and 4B requires analog circuitry adapted to detect the intermediate voltage levels.

Referring to FIG. 5, encoder 500 is shown as including, in part, a flip-flop 502, a flip-flop 504, a flip-flop 506, a flip-flop 508, a flip-flop 510, a logic 512, a phase-shift logic 514, logic instructions 516, a logic gate 518, a logic gate 520, and a logic gate 522.

The flip-flop 502 receives an input data stream and sends a transformed signal to the flip-flop 504 and the logic 512. The flip-flop 504 receives a signal from the flip-flop 502 and sends a transformed signal to the logic 512. The flip-flop 506 receives a signal from the logic 512 and sends a transformed signal to the logic 512.

The logic 512 receives signals from the flip-flop 502, the flip-flop 504, the flip-flop 506, and the flip-flop 510, utilizes the logic instructions 500 shown in Table I received to encode those signals, and sends the transformed signals to the flip-flop 506, the flip-flop 508, and the flip-flop 510.

The flip-flop 508 and the flip-flop 510 receive the signal transformed by the logic 512, perform further transformations, and send those signals to the phase-shift logic 514. The flip-flop 510 further sends a transformed signal to the logic 512.

The phase-shift logic 514 may comprise one or more logic gates (here, the logic gate 518, the logic gate 520, and the logic gate 522). The phase-shift logic 514 transforms the signals receive from the flip-flop 508 and the flip-flop 510, and outputs an encoded data stream.

The logic instructions 516 may be stored in a memory structure, altering the operation of the logic 512 when received. In some embodiments, the outputs of the flip-flop 508 and the flip-flop 510 represent the first and second halves of the encoded signal within a clock period.

Figure 6:
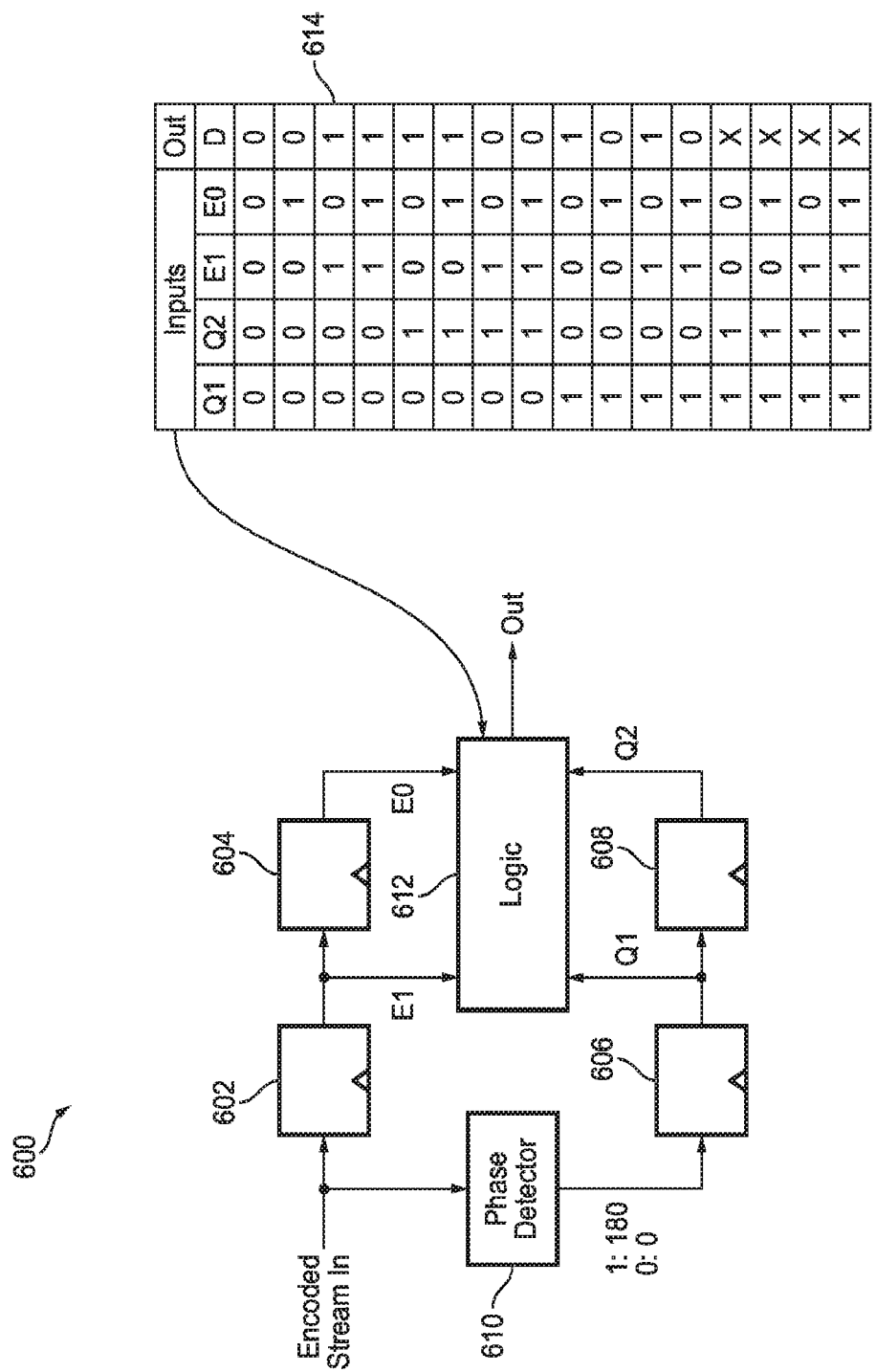
FIG. 6 is a simplified high-level block diagram of a decoder, in accordance with one embodiment of the present invention.

FIG. 6 is a simplified logic block diagram of a decoder 600 configured to decode data encoded as shown in FIGS. 5A and 5, in accordance with one embodiment of the present invention. In decoder 600 the transmission rate is assumed to be the same as the maximum available clock rate. Phase detector 610 is configured to determine if a phase shift has occurred, not the direction of the transition. The logic imputes the encoding shown in FIGS. 2A and 2b based on the previous bit value. The output OUT of logic block 612 represents the decoded bit.

Referring to FIG. 6, decoder 600 is shown, as including, in part, a flip-flop 602, a flip-flop 604, a flip-flop 606, a flip-flop 608, a phase detector 610, logic 612, and logic instructions 614.

The flip-flop 602 receives an input encoded data steam and sends a transformed signal to the flip-flop 604 and the logic 612. The flip-flop 604 receives the signal from the flip-flop 602 and sends a transformed signal to the logic 612. The flip-flop 606 receives a phase detected signal from the phase detector 610 and sends a transformed signal to the flip-flop 608 and the logic 612. The flip-flop 608 receives the signal from the flip-flop 606 and sends a transformed signal to the logic 612.

The phase detector 610 receives the input encoded data steam and detects the phase of the input encoded data steam.

The phase detector 610 may transform the signal. For example, receiving a 180 phase state is transformed into a 1 and a 0 phase state is transformed into a 0. The phase detector 610 sends the signal to the flip-flop 606.

The logic 612 receives a signal from the flip-flop 602, the flip-flop 604, the flip-flop 606, and the flip-flop 608. The logic 612 further receives the logic instructions 614, which may be received from a memory structure. The logic 612 utilizes the logic instructions 614 to transform the signals into a decoded signal.

Figure 7:
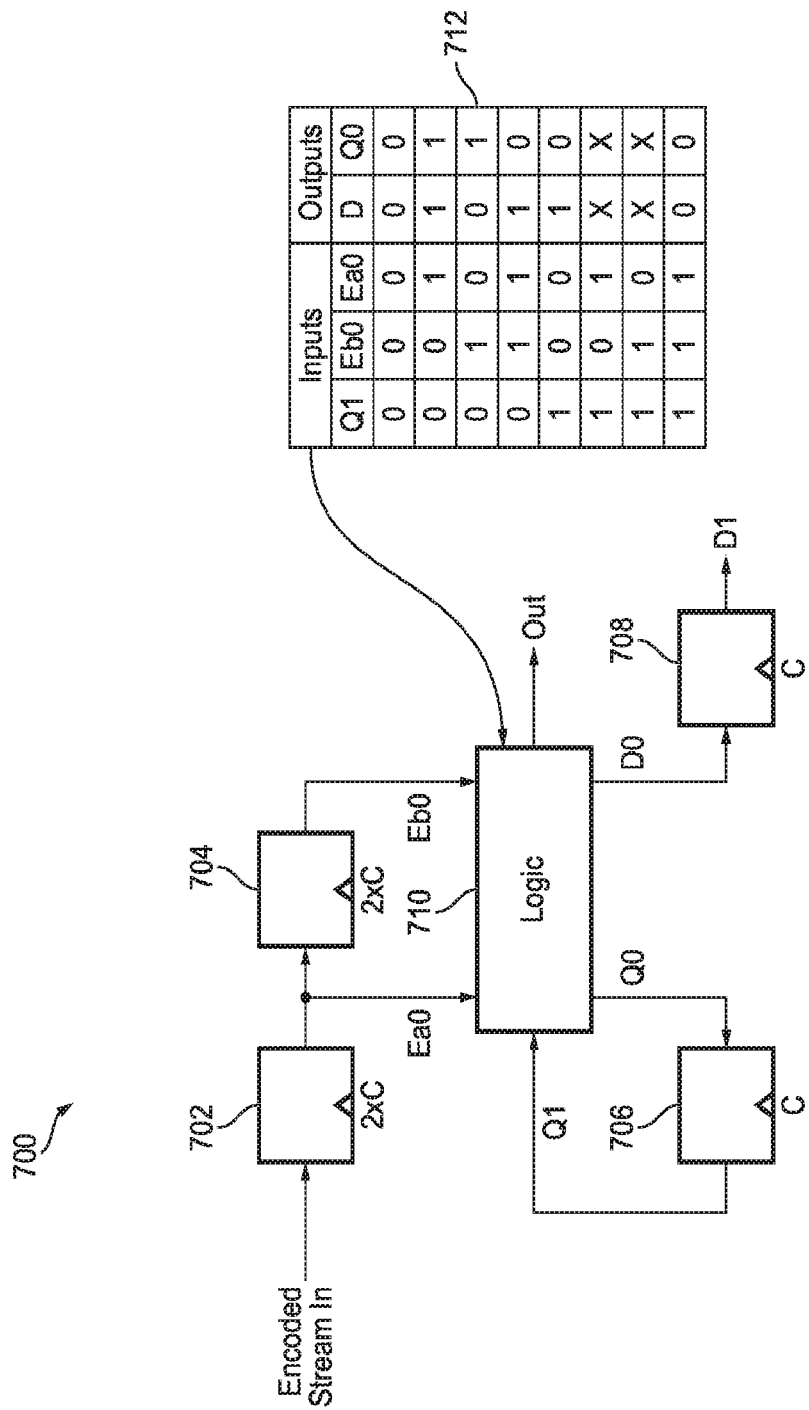
FIG. 7 is a simplified high-level block diagram of a decoder, in accordance with another embodiment of the present invention.

FIG. 7 shows a decoder 700 configured to decode data encoded as described above with reference to FIGS. 2A and 2B for cases where the transmission bit rate is lower than the clock available at the decoder. Decoder 700 is shown as including, in part, a flip-flop 702, a flip-flop 704, a flip-flop 706, a flip-flop 708, logic 710, and logic instructions 712.

The flip-flop 702 receives an input encoded data steam and sends a transformed signal to the flip-flop 704 and the logic 710. The flip-flop 704 receives the signal from the flip-flop 702 and sends a transformed signal to the logic 710. The flip-flop 706 receives a signal from the logic 710 and sends a transformed signal to the logic 710. The flip-flop 708 receives the signal from the logic 710 and outputs a decoded signal.

The logic 710 receives a signal from the flip-flop 702, the flip-flop 704, the flip-flop 706, and the flip-flop 708. The logic 710 further receives the logic instructions 712, which may be received from a memory structure. The logic 710 utilizes the logic instructions 712 to transform the signals into a decoded signal. The output OUT of logic block 612 represents the decoded bit.

Figure 8:
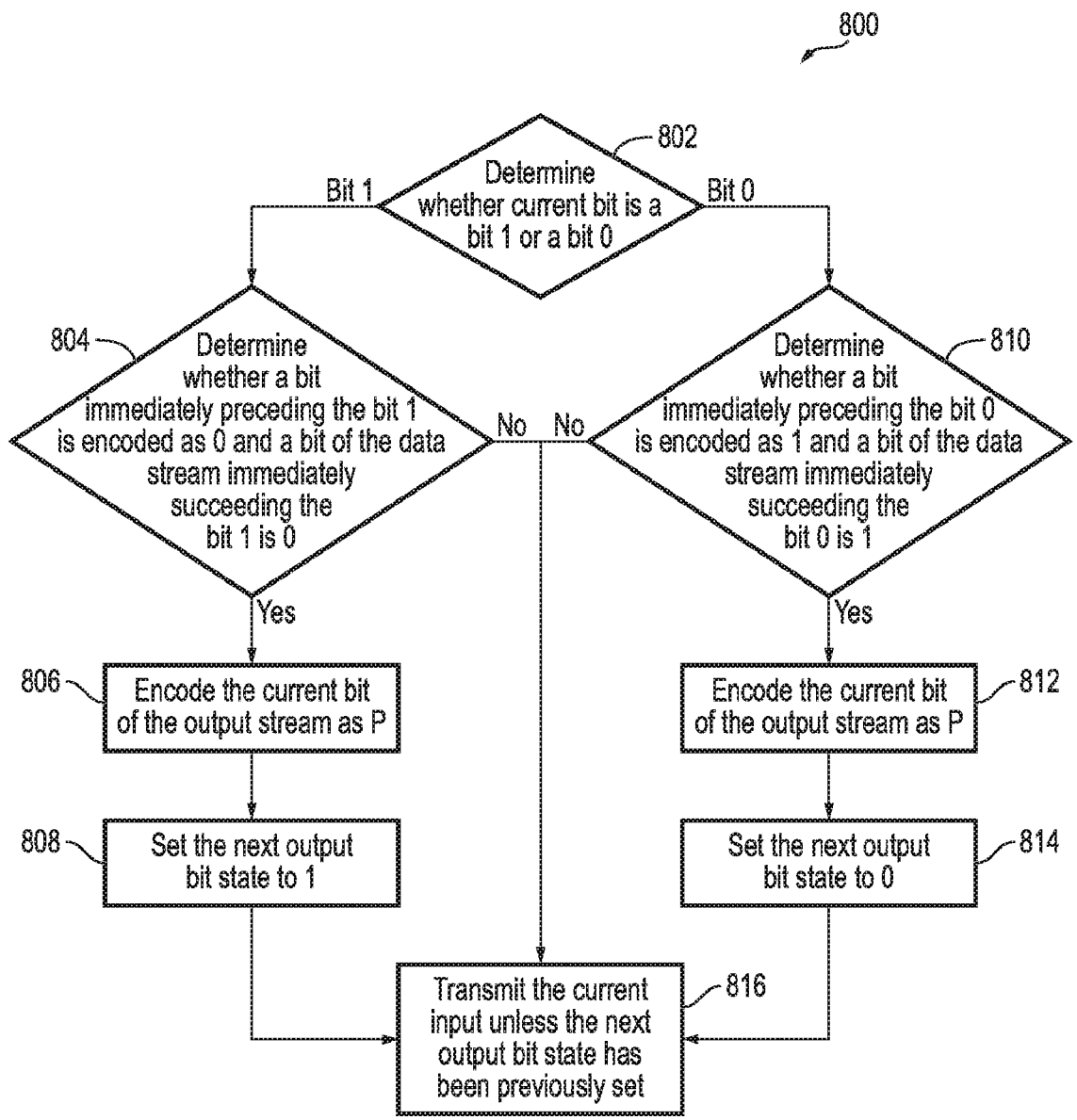
FIG. 8 is a flowchart for encoding data, in accordance with one embodiment of the present invention.

FIG. 8 is a flowchart 800 for encoding data, as described above. In FIG. 8, symbol P represents either a phase shift involving a 1-0 or a 1-0 transition, or a third voltage level, as described above with references to FIGS. 2A, 2B, 4A and 4B. It is understood that the direction of the phase shift (0 to 1, or 1 to 0) does not affect the analysis insofar as the context is known from the previous and next bits. At 802 it is determined whether a current bit is a bit 1 or a bit 0. If at 802 the bit is determined to a be a 1, and subsequently at 804 it is determined that a bit immediately preceding the bit 1 is encoded as 0 and a bit of the data stream immediately succeeding the bit 1 is 0, then at 806 the current bit of the output stream in encoded as P. Next, at 808, the next output bit state is set to 1. Thereafter, at 816 the current input is transmitted unless the next output state has been previously set. If at 804 it is not determined that a bit immediately preceding the bit 1 is encoded as 0 and a bit of the data stream immediately succeeding the bit 1 is 0, then at 816 the current input is transmitted unless the next output state has been previously set.

If at 802 the bit is determined to a be a 0, and subsequently at 810 it is determined that a bit immediately preceding the bit 0 is encoded as 1 and a bit of the data stream immediately succeeding the bit 0 is 1, then at 812 the current bit of the output stream in encoded as P. Next, at 814, the next output bit state is set to 0. Thereafter, at 816 the current input is transmitted unless the next output state has been previously set. If at 810 it is not determined that a bit immediately preceding the bit 0 is encoded as 1 and a bit of the data stream immediately succeeding the bit 0 is 1, then at 816 the current input is transmitted unless the next output state has been previously set.

Figure 9:
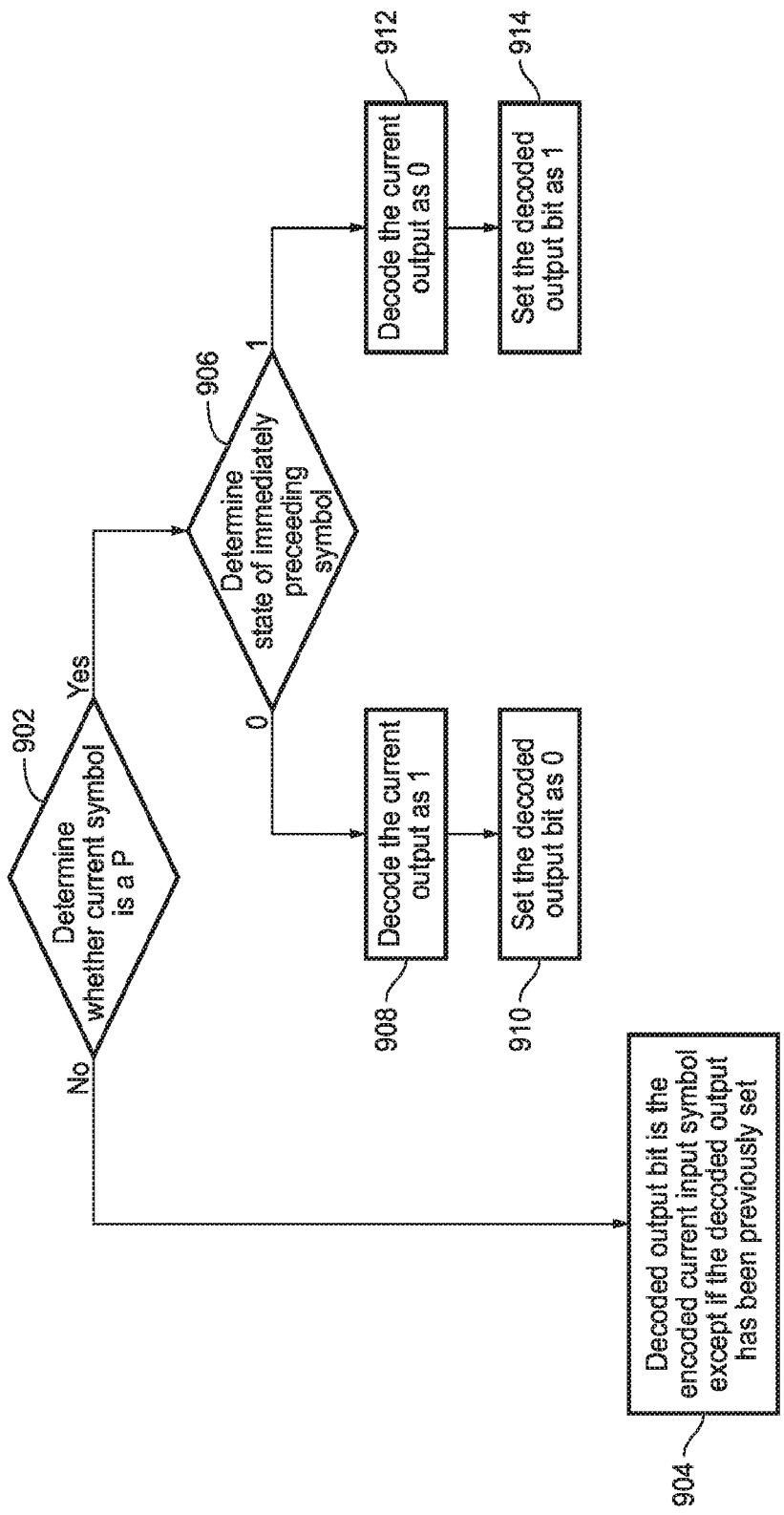
FIG. 9 is a flowchart for decoding data, in accordance with another embodiment of the present invention.

FIG. 9 is a flowchart 900 for decoding data encoded as described above with reference to FIGS. 2A and 2B, 4A and 4B. In FIG. 8, symbol P represents either a phase shift involving a 1-0 or a 1-0 transition, or a third voltage level, as described above with references to FIGS. 2A, 2B, 4A and 4B. If at 902 it is determined that the symbol is not a P, then at 904, the output bit is decoded as the encoded current input symbol except if the decoded output has been previously set.

If at 902 it is determined that the symbol is a P, then at 906 the state of the immediately preceding symbol is determined. If at 906, the state of the immediately preceding symbol is determined as a 0, then at 908 the current output bit is decoded as 1. Subsequently at 910 the next output bit is decoded as 0. If at 906, the state of the immediately preceding symbol is determined as a 1, then at 912 the current output bit is decoded as 0. Subsequently at 914 the next output bit is decoded as 1.

Figure 10:
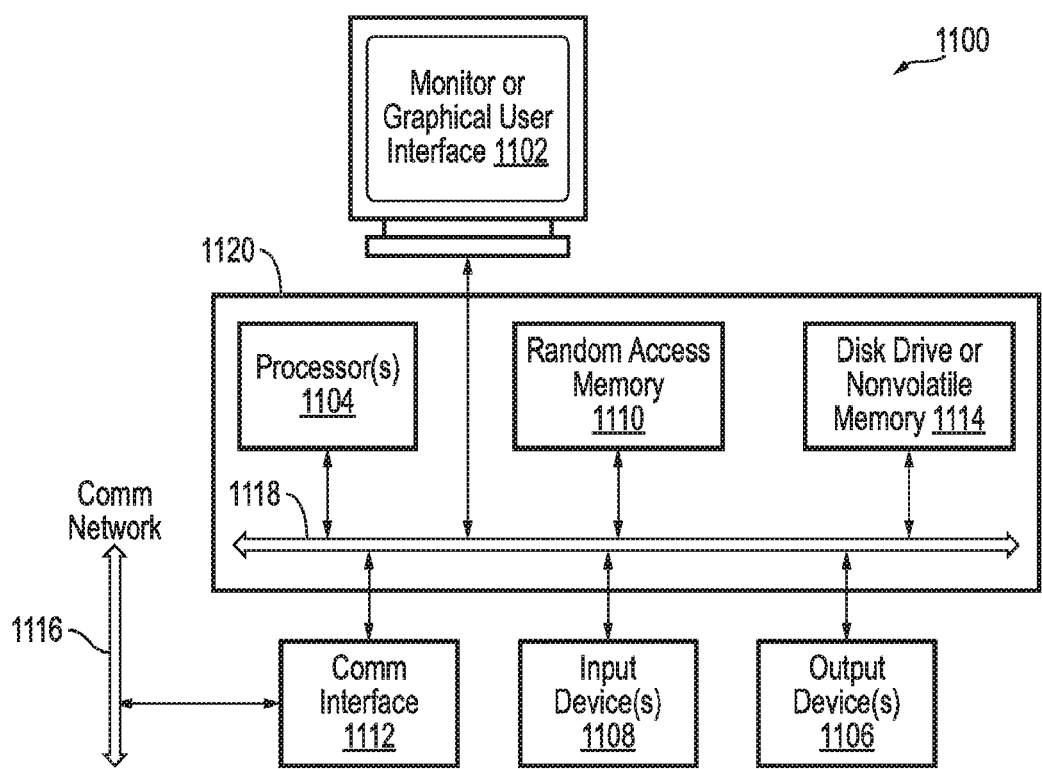
FIG. 10 is a simplified high-level block diagram of a computer system 1100 in which the present invention may be embodied.

FIG. 10 is an example block diagram of a computer system 1100 that may incorporate embodiments of the present invention. FIG. 10 is merely illustrative of a machine system to carry out aspects of the technical processes described herein, and does not limit the scope of the claims. One of ordinary skill in the art would recognize other variations, modifications, and alternatives. In one embodiment, the computer system 1100 typically includes a monitor or graphical user interface 1102, a computer 1120, a communication network interface 1112, input device(s) 1108, output device(s) 1106, and the like.

As depicted in FIG. 10, the computer 1120 may include one or more processor(s) 1104 that communicate with a number of peripheral devices via a bus subsystem 1118. These peripheral devices may include input device(s) 1108, output device(s) 1106, communication network interface 1112, and a storage subsystem, such as a random access memory 1110 and a disk drive or nonvolatile memory 1114.

The input device(s) 1108 include devices and mechanisms for inputting information to the computer 1120. These may include a keyboard, a keypad, a touch screen incorporated into the monitor or graphical user interface 1102, audio input devices such as voice recognition systems, microphones, and other types of input devices. In various embodiments, the input device(s) 1108 are typically embodied as a computer mouse, a trackball, a track pad, a joystick, wireless remote, drawing tablet, voice command system, eye tracking system, and the like. The input device(s) 1108 typically allow a user to select objects, icons, text and the like that appear on the monitor or graphical user interface 1102 via a command such as a click of a button or the like.

The output device(s) 1106 include all possible types of devices and mechanisms for outputting information from the computer 1120. These may include a display (e.g., monitor or graphical user interface 1102), non-visual displays such as audio output devices, etc.

The communication network interface 1112 provides an interface to communication networks (e.g., communication network 1116) and devices external to the computer 1120. The communication network interface 1112 may serve as an interface for receiving data from and transmitting data to other systems. Embodiments of the communication network interface 1112 typically include an Ethernet card, a modem (telephone, satellite, cable, ISDN), (asynchronous) digital subscriber line (DSL) unit, FireWire interface, USB interface, and the like. For example, the communication network interface 1112 may be coupled to the communication network 1116 via a FireWire bus, or the like. In other embodiments, the communication network interface 1112 may be physically integrated on the motherboard of the computer 1120, and may be a software program, such as soft DSL, or the like.

In various embodiments, the computer system 1100 may also include software that enables communications over a network such as the HTTP, TCP/IP, RTP/RTSP protocols, and the like. In alternative embodiments, other communications software and transfer protocols may also be used, for example IPX, UDP or the like. In some embodiments, the computer 1120 in the processor(s) 1104 may include one or more microprocessors from Intel®. Further, one embodiment, the computer 1120 includes a UNIX-based operating system.

The random access memory 1110 and the disk drive or nonvolatile memory 1114 are examples of tangible media configured to store data and instructions to implement various embodiments of the processes described herein, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The random access memory 1110 and the disk drive or nonvolatile memory 1114 may be configured to store the basic programming and data constructs that provide the functionality of the disclosed processes and other embodiments thereof that fall within the scope of the present invention.

Software code modules and instructions that implement embodiments of the present invention may be stored in the random access memory 1110 and/or the disk drive or nonvolatile memory 1114. These software modules may be executed by the processor(s) 1104. The random access memory 1110 and the disk drive or nonvolatile memory 1114 may also provide a repository for storing data used by the software modules.

The random access memory 1110 and the disk drive or nonvolatile memory 1114 may include a number of memories including a main random access memory (RAM) for storage of instructions and data during program execution and a read only memory (ROM) in which fixed non-transitory instructions are stored. The random access memory 1110 and the disk drive or nonvolatile memory 1114 may include a file storage subsystem providing persistent (non-volatile) storage for program and data files. The random access memory 1110 and the disk drive or nonvolatile memory 1114 may include removable storage systems, such as removable flash memory.

The bus subsystem 1118 provides a mechanism for letting the various components and subsystems of computer 1120 communicate with each other as intended. Although the communication network interface 1112 is depicted schematically as a single bus, alternative embodiments of the bus subsystem 1118 may utilize multiple busses.

FIG. 10 is representative of a computer system capable of implementing embodiments of the present invention. It will be readily apparent to one of ordinary skill in the art that many other hardware and software configurations are suitable for use with embodiments of the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention may be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above descriptions of embodiments of the present invention are illustrative and not limitative. In addition, similar principles as described corresponding to latches and/or flops can be applied to other sequential logic circuit elements. Other modifications and variations will be apparent to those skilled in the art and are intended to fall within the scope of the appended claims.

What is claimed is:

1. A method of encoding a stream of data bits using an integrated circuit having voltage transitions between a high voltage level state and a low voltage level state, the method comprising:

encoding, by the integrated circuit, a first bit having a value of 1 and occurring at a n-th clock cycle of the stream of data bits as a first symbol if a bit of the stream of data bits occurring at a (n−1)-th clock cycle immediately preceding the first bit is encoded as a second symbol and a bit of the stream of data bits occurring at a (n+1)-th clock cycle immediately succeeding the first bit has a value of 0, where n is a positive integer; and encoding, by the the integrated circuit, the bit occurring at the (n+1)-th clock cycle immediately succeeding the first bit as the first symbol.

2. The method of claim 1, further comprising:
encoding, by the encoder, a second bit having a value of 0 and occurring at a m-th clock cycle of the stream of data bits as the second symbol if a bit of the stream of data bits occurring at a (m−1)-th clock cycle immediately preceding the second bit is encoded as the first symbol and a bit of the stream of data bits occurring at a (m+1)-th clock cycle immediately succeeding the second bit has a value of 1; and
encoding, by the encoder, the bit occurring at the (m+1)-th clock cycle immediately succeeding the second bit as the first symbol.

3. The method of claim 2, wherein each of at least a first plurality of the first symbols is represented by a 0 to 1 transition occurring with a phase delay relative to a phase of a clock used in encoding the data.

4. The method of claim 3, wherein each of at least a first plurality of the second symbols is represented by a 1 to 0 transition occurring with the phase delay.

5. The method of claim 2, wherein said phase delay is 180 degrees.

6. The method of claim 5, wherein said first symbol is represented by a first voltage level and said second symbol is represented by a second voltage level.

7. A method of encoding a stream of data bits using an integrated circuit having voltage transitions between a high voltage level state and a low voltage level state, the method comprising:
encoding, by the integrated circuit, a first bit having a value of 1 and occurring at a n-th clock cycle of the stream of data bits as a first symbol if a bit of the stream of data bits occurring at a (n−1)-th clock cycle immediately preceding the first bit is encoded as a second symbol and a bit of the stream of data bits occurring at a (n+1)-th clock cycle immediately succeeding the first bit has a value of 0, where n is a positive integer; and
encoding, by the integrated circuit, the bit occurring at the (n+1)-th clock cycle immediately succeeding the first bit as a third symbol.

8. The method of claim 7, further comprising:
encoding, by the encoder, a second bit having a value of 0 and occurring at a m-th clock cycle of the stream of data bits as the first symbol if a bit of the stream of data bits occurring at a (m−1)-th clock cycle immediately preceding the second bit is encoded as the third symbol and a bit of the stream of data bits occurring at a (m+1)-th clock cycle immediately succeeding the second bit has a value of 1; and
encoding, by the encoder, the bit occurring at the (m+1)-th clock cycle immediately succeeding the second bit as the first symbol.

9. The method of claim 8 wherein said first, second and third symbols are respectively represented by first, second and third voltage levels.

10. An integrated circuit encoder having voltage transitions between a high voltage level state and a low voltage level state, the integrated circuit encoder configured to:
encode a first bit having a value of 1 and occurring at a n-th clock cycle of the stream of data bits as a first symbol if a bit of the stream of data bits occurring at a (n−1)-th clock cycle immediately preceding the first bit is encoded as a second symbol and a bit of the stream of data bits occurring at a (n+1)-th clock cycle immediately succeeding the first bit has a value of 0, where n is a positive integer; and
encode the bit occurring at the (n+1)-th clock cycle immediately succeeding the first bit as the first symbol.

11. The encoder of claim 10, wherein said encoder is further configured to:
encode a second bit having a value of 0 and occurring at a m-th clock cycle of the stream of data bits as the second symbol if a bit of the stream of data bits occurring at a (m−1)-th clock cycle immediately preceding the second bit is encoded as the first symbol and a bit of the stream of data bits occurring at a (m+1)-th clock cycle immediately succeeding the second bit has a value of 1; and
encode the bit occurring at the (m+1)-th clock cycle immediately succeeding the second bit as the first symbol.

12. The encoder of claim 11, wherein each of at least a first plurality of the first symbols is represented by a 0 to 1 transition occurring with a phase delay relative to a phase of a clock used in the encoder.

13. The encoder of claim 12, wherein each of at least a first plurality of the second symbols is represented by a 1 to 0 transition occurring with the phase delay.

14. The encoder of claim 13, wherein said phase delay is 180 degrees.

15. The encoder of claim 10, wherein said first symbol is represented by a first voltage level and said second symbol is represented by a second voltage level.

16. An integrated circuit encoder having voltage transitions between a high voltage level state and a low voltage level state, the integrated circuit encoder configured to:
encode a first bit having a value of 1 and occurring at a n-th clock cycle of the stream of data bits as a first symbol if a bit of the stream of data bits occurring at a (n−1)-th clock cycle immediately preceding the first bit is encoded as a second symbol and a bit of the stream of data bits occurring at a (n+1)-th clock cycle immediately succeeding the first bit has a value of 0, where n is a positive integer; and
encode the bit occurring at the (n+1)-th clock cycle immediately succeeding the first bit as a third symbol.

17. The encoder of claim 16, wherein the encoder is further configured to:
encode a second bit having a value of 0 and occurring at a m-th clock cycle of the stream of data bits as the first symbol if a bit of the stream of data bits occurring at a (m−1)-th clock cycle immediately preceding the second bit is encoded as the third symbol and a bit of the stream of data bits occurring at a (m+1)-th clock cycle immediately succeeding the second bit has a value of 1; and
encode the bit occurring at the (m+1)-th clock cycle immediately succeeding the second bit as the first symbol.

18. The encoder of claim 17, wherein said first, second and third symbols are respectively represented by first, second and third voltage levels.

19. A method of decoding encoded data using an integrated circuit having voltage transitions between a high voltage level state and a low voltage level state, the method comprising:
decoding, by the integrated circuit, a first symbol of the encoded data as a bit having a value of 1 if a symbol immediately preceding the first symbol is a second symbol and a symbol immediately succeeding the first symbol is the first symbol; and
decoding, by the integrated circuit, the symbol immediately succeeding the first symbol as a bit having a value of 0.

20. The method of claim 19, further comprising:
  decoding, by the decoder, the second symbol of the encoded data as a bit having a value of 0 if a symbol immediately preceding the second symbol is the first symbol and a symbol immediately succeeding the second symbol is the second symbol; and
  decoding, by the decoder, the symbol immediately succeeding the second symbol as a bit having a value of 1.

21. The method of claim 20, wherein each of at least a first plurality of the first symbols is represented by a 0 to 1 transition occurring with a phase delay relative to a phase of a clock used in encoding the data.

22. The method of claim 20, wherein each of at least a first plurality of the second symbols is represented by a 1 to 0 transition occurring with the phase delay.

23. The method of claim 22, wherein said phase delay is 180 degrees.

24. The method of claim 23, wherein said first symbol is represented by a first voltage level and said second symbol is represented by a second voltage level.

25. An integrated circuit decoder having voltage transitions between a high voltage level state and a low voltage level state, the integrated circuit decoder configured to:
  decode a first symbol of the encoded data as a bit having a value of 1 if a symbol immediately preceding the first symbol is a second symbol and a symbol immediately succeeding the first symbol is the first symbol; and
  decode the symbol immediately succeeding the first symbol as a bit having a value of 0.

26. The decoder of claim 25, wherein said decoder is further configured to:
  decode the second symbol of the encoded data as a bit having a value of 0 if a symbol immediately preceding the second symbol is the first symbol and a symbol immediately succeeding the second symbol is the second symbol; and
  decode the symbol immediately succeeding the second symbol as a bit having a value of 1.

27. The decoder of claim 26, wherein each of at least a first plurality of the first symbols is represented by a 0 to 1 transition occurring with a phase delay relative to a phase of a clock used in encoding the data.

28. The decoder of claim 27, wherein each of at least a first plurality of the second symbols is represented by a 1 to 0 transition occurring with the phase delay.

29. The decoder of claim 28, wherein said phase delay is 180 degrees.

30. The decoder of claim 29, wherein said first symbol is represented by a first voltage level and said second symbol is represented by a second voltage level.

* * * * *